(12) United States Patent
Bennett et al.

(10) Patent No.: US 6,420,087 B1
(45) Date of Patent: Jul. 16, 2002

(54) DIRECT POSITIVE LITHOGRAPHIC PLATE

(75) Inventors: Peter A. R. Bennett; John A. Hearson, both of West Yorkshire; Carole-Anne Smith, West Lothian, all of (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/297,443

(22) PCT Filed: Oct. 28, 1997

(86) PCT No.: PCT/GB97/02962

§ 371 (c)(1),
(2), (4) Date: Apr. 30, 1997

(87) PCT Pub. No.: WO98/19219

PCT Pub. Date: May 7, 1998

(30) Foreign Application Priority Data

Oct. 31, 1996 (GB) ............................................... 9622657

(51) Int. Cl.$^7$ .............................. G03F 7/038; C08F 8/34
(52) U.S. Cl. ............................... 430/272.1; 430/273.1; 430/281.1; 430/192; 430/75; 430/286.1
(58) Field of Search ............................. 430/270.1, 192, 430/75, 286.1, 281.1

(56) References Cited

U.S. PATENT DOCUMENTS

| | | | |
|---|---|---|---|
| 2,766,118 A | 10/1956 | Sus et al. ...................... 95/7 |
| 2,767,092 A | 10/1956 | Schmidt ......................... 95/7 |
| 2,772,972 A | 12/1956 | Herrick, Jr. et al. ............ 96/33 |
| 2,859,112 A | 11/1958 | Sus et al. ....................... 96/91 |
| 2,907,665 A | 10/1959 | Farher .......................... 106/49 |
| 3,046,110 A | 7/1962 | Schmidt ......................... 96/33 |
| 3,046,111 A | 7/1962 | Schmidt ......................... 96/33 |
| 3,046,115 A | 7/1962 | Schmidt et al. ................. 96/33 |
| 3,046,118 A | 7/1962 | Schmidt ......................... 96/33 |
| 3,046,119 A | 7/1962 | Sus ............................... 96/33 |
| 3,046,120 A | 7/1962 | Schmidt et al. ................. 96/33 |
| 3,046,121 A | 7/1962 | Schmidt ......................... 96/33 |
| 3,046,122 A | 7/1962 | Sus ............................... 96/33 |
| 3,046,123 A | 7/1962 | Sus et al. ....................... 96/33 |
| 3,061,430 A | 10/1962 | Uhlig et al. ..................... 96/33 |
| 3,102,809 A | 9/1963 | Endermann et al. ............ 96/33 |
| 3,106,465 A | 10/1963 | Neugebaner et al. .......... 96/33 |
| 3,635,709 A | 1/1972 | Kobayshi ....................... 96/33 |
| 3,647,443 A | 3/1972 | Rauner et al. .................. 96/33 |
| 4,510,227 A | 4/1985 | Mohr et al. .................. 430/175 |
| 4,722,881 A | 2/1988 | Ueno et al. .................. 430/192 |
| 4,842,988 A | * 6/1989 | Hermann et al. ............. 430/14 |
| 4,942,109 A | * 7/1990 | Koizumi et al. ............. 430/175 |
| 5,015,554 A | 5/1991 | Ruckert et al. .............. 430/270 |
| 5,165,343 A | 11/1992 | Inoue et al. .................. 101/395 |
| 5,264,318 A | 11/1993 | Yabe et al. .................. 430/175 |
| 5,378,584 A | * 1/1995 | Frass et al. .................. 430/165 |
| 5,541,263 A | * 7/1996 | Thackeray et al. ....... 525/328.8 |
| 5,585,223 A | 12/1996 | Frechet et al. .............. 430/296 |
| 5,716,753 A | * 2/1998 | Yoshimoto et al. ......... 430/191 |
| 5,948,591 A | * 9/1999 | Wermeersch et al. .... 430/270.1 |

FOREIGN PATENT DOCUMENTS

| | | |
|---|---|---|
| EP | 42104 | 3/1981 |
| EP | 360618 | 3/1990 |
| EP | 564389 | 6/1993 |
| EP | 720057 | 3/1996 |
| EP | 742490 | 11/1996 |
| EP | 764522 | 3/1997 |
| GB | 1245924 | 9/1971 |
| GB | 1266612 | 3/1972 |
| JP | 62153335 | 7/1987 |
| JP | 2097948 A | 4/1990 |
| JP | 409146268 A * | 6/1997 |
| WO | WO 97/39894 | 10/1997 |

OTHER PUBLICATIONS

Japan patent 402052350A, abstract; Katsuragi et al. Feb. 21, 1990; Postive type photoresist compostition.*

* cited by examiner

Primary Examiner—Janet Baxter
Assistant Examiner—Yvette M. Clarke
(74) Attorney, Agent, or Firm—Ratner & Prestia

(57) ABSTRACT

A positive working lithographic plate precursor comprising a support having a hydrophilic surface and a coating thereon comprising a positive working, photosensitive composition and an aryl alkyl polysiloxane. A method of preparing a positive working lithographic plate precursor comprising coating on a support having a hydrophilic surface a coating comprising, in admixture, a positive working photosensitive composition and an aryl alkyl polysiloxane.

37 Claims, No Drawings

DIRECT POSITIVE LITHOGRAPHIC PLATE

This application is a U.S. National Phase Application of PCT International Application PCT/GB97/02962, international filing date Oct. 28, 1997.

FIELD OF THE INVENTION

This invention relates to the production of positive working lithographic plates.

BACKGROUND OF THE INVENTION

Positive working lithographic plates are very widely manufactured and probably account for over half of all lithographic plates. The photosensitive compositions used are comparatively simple and easy to manufacture, typically comprising an o-quinonediazide light sensitive component and a phenolic resin. Their processing after image-wise exposure is also simple. However, if the processing is not carried out according to the manufacturers instructions, such as the use of developing solutions which are stronger than that recommended or if temperature of the developing solution is too hot, there is a tendency for the developing solution to remove not only the exposed areas of the plate but also to attack the image areas in the non-exposed areas of the plate. This attack on the printing image areas produces a poor image and in many cases renders the plate unusable. The use of strong developing solutions exacerbates the problem of image attack, as does developing times over 30 seconds as are often used in the processing of direct positive plates.

Common formulation means for decreasing attack by strong developers or through the use of conditions leading to over development, such as using phenolic resins with reduced alkali solubility, would normally lead to a reduction in plate sensitivity for the same plate under less aggressive development conditions. Accordingly methods to increase plate sensitivities, such as the use of speed enhancers, often result in reduced resistance to developer attack

SUMMARY OF THE INVENTION

We have discovered a positive working lithographic plate precursor and methods of producing said precursor which exhibit a reduced tendency to developer attack of the image obtained after image-wise exposure under aggressive development whilst significantly reducing any accompanying loss of sensitivity in less aggressive developers and development conditions.

Therefore according to the present invention there is provided a positive working lithographic plate precursor comprising a support having a hydrophilic surface and a coating thereon comprising a positive working photosensitive composition and an aryl alkyl polysiloxane.

According to a further aspect of the invention there is provided a positive working lithographic plate precursor comprising a support having a hydrophilic surface and a coating thereon comprising a positive working, photosensitive composition and an aryl alkyl polysiloxane at least part of which aryl alkyl polysiloxane is present as a thin layer at the uppermost surface of the plate precursor.

According to a further aspect of the present invention there is provided a method of preparing a positive working lithographic plate precursor of the present invention comprising coating on a support having a hydrophilic surface a coating comprising in admixture a positive working photosensitive composition and an aryl alkyl polysiloxane.

DETAILED DESCRIPTION OF THE INVENTION

A preferred aryl alkyl polysiloxane useful in the present invention is a phenyl methyl polysiloxane.

Suitably the aryl alkyl polysiloxane constitutes at least 0.3%, preferably at least 1%, preferably up to 50%, more preferably up to 10% by weight of the dry coating. Thus a preferred weight range for the aryl alkyl polysiloxane may be expressed as 1–10% of the total dry coating weight.

The preferred positive working photosensitive compositions of the present invention are those comprising an o-napthoquinone diazide as the light sensitive component. Most preferably these are present either as sulphonic acid esters or as carboxylic acid esters.

Examples of particularly preferred o-quinone diazide compounds are disclosed in a variety of publications such as U.S. Pat. Nos. 2,766,118; 2,767,092, 2,772,972; 2,859,112; 2,907,665; 3,046,110; 3,046,111; 3,046,115; 3,046,118; 3,046,119; 3,046,120; 3,046,121; 3,046,122, 3,046,123; 3,061,430; 3,102,809, 3,106,465; 3,635,709 and 3,647,443 and these compounds may preferably be used in the invention. Among these, particularly preferred are o-naphthoquinonediazidosulfonates or o-naphthoquinonediazido carboxylates of aromatic hydroxyl compounds; o-naphthoquinonediazidosulfonic acid amides or o-naphthoquinonediazido-carboxylic acid amides of aromatic amine compounds, for instance, esters of benzoquinone-1,2-diazidosulfonic acid or naphthoquinone-1,2-diazidosulfonic acid with polyhydroxyphenyl (hereinafter the term "ester" also include partial esters); esters of naphthoquinone-1,2-diazido-4-sulfonic acid or naphthoquinone-1,2-diazido-5-sulfonic acid with pyrogallo/ acetone, resins; esters of benzoquinone-1,2- diazidosulfonic acid or naphthoquinone-1,2-diazidosulfonic acid with novolak type phenol/formaldehyde resins or novalak type cresol/formaldehyde resins; amides of poly(p-aminostyrene) and naphthoquinone-1,2-diazido4-sulfonic acid or naphthoquinone-1,2- diazido-5-sulfonic acid; esters of poly (p-hydroxystyrene) and naphthoquinone-1,2- diazido-5-sulfonic acid; esters of polyethylene glycol with naphthoquinone-1,2-diazido-4-sulfonic acid or naphthoquinone-1, 2-diazido 5-sulfonic acid: amides of polymeric amines with naphthoquinone-1,2-diazido-4-sulfonic.

The preferred binder for the photosensitive composition is an alkali soluble resin. Particularly useful as the alkali soluble resins are the condensation products from the interaction between phenol, C-alkyl substituted phenols (such as cresols and p-tert-butyl-phenol), diphenols (such as bisphenol-A) and aldehydes (such as formaldehyde). Particularly useful in this invention are novolak resins, resole resins and novolak/resole resin mixtures.

The most preferred photosensitive composition comprises o-napthoquinonediazide sulphonyl esters of a phenolic resin.

Suitably the photosensitive composition constitutes at least 50%, preferably at least 90%, preferably up to 99.7%, more preferably up to 99% by weight of the dry coating. Thus a preferred weight range for the photosensitive composition may be expressed as 90–99% of the total dry coating weight.

Suitable solvents for the coating solutions are, for example, the known glycol derivatives (such as 2-ethoxy ethanol and 1-methoxy-propan-2-ol) and ketones (such as butanone) in common use for the manufacture of such photosensitive coatings.

The wet coated composition is dried at elevated temperatures to remove coating solvents. If drying temperature or drying time is too low then residual solvents can adversely effect the resulting developer resistance of the coating. If drying, is too severe then unwanted reactions can occur in the drying film. Preferably the coated compositions are dried between 100° C. for 210 seconds and 130° C. for 90 seconds.

According to a further preferred embodiment there is provided a method of preparing a positive working lithographic plate precursor according to the present invention comprising coating on a support having a hydrophilic surface a positive working photosensitive composition and applying an additional composition comprising an aryl alkyl polysiloxane on said photosensitive layer.

Suitably the aryl alkyl polysiloxane is laid down to a dry film weight of at least 0.02 $gm^{-2}$, preferably at least 0.05 $gm^{-2}$, preferably up to 0.6 $gm^{-2}$, more preferably up to 0.4 $gm^{-2}$. Thus a preferred weight range for the aryl alkyl polysiloxane may be expressed as 0.05–0.4 $gm^{-2}$ dry film weight.

The aryl alkyl polysiloxane composition can be applied to the photosensitive layer by various means such as spraying. Suitably the composition is coated onto the photosensitive layer.

Whilst the applicants do not wish to be limited by any theoretical explanation of how their invention operates, it is believed that the presence of at least part of the aryl alkyl polysiloxane at the uppermost surface of the precursor is a key factor. It is believed that during the first method of the present invention at least part of the aryl alkyl polysiloxane separates out of the coating and deposits thereon. Thus resistance to developer attack is manifested particularly at the surface of the coating in all precursors of the present invention. Dynamic contact angle studies (using a Cahn Dynamic Contact Angle Analyser) have clearly showed a marked effect on the surface of plates prepared according to the methods of the present invention. A typical positive working lithographic printing, plate precursor has advancing and receding contact angles in water of approximately 95° and 48° respectively. Whereas a precursor provided by either method of the present invention comprising, for example, a phenyl methyl polysiloxane has advancing and receding contact angles in water of approximately 95° and 67° respectively. A surface of the same phenyl methyl polysiloxane alone provided on the same substrate has advancing and receding contact angles in water of approximately 95° and 67° respectively. Thus a surface change has been affected on the precursor which provides a surface nature similar to that of the polysiloxane coated as a single component.

The base which can be used as the support having a hydrophilic surface is preferably an aluminium plate which has undergone the usual anodic, graining and post-anodic treatments well known in the lithographic art for enabling a photosensitive composition to be coated thereon and for the surface of the support to function as a printing background.

Another base material which may be used in the method of the present invention is a plastic material base or a treated paper base as used in the photographic industry. A particularly useful plastic material base is polyethylene terephthalate which has been subbed to render its surface hydrophilic. Also a so-called resin coated paper which has been corona discharge treated can also be used.

The photosensitive compositions of the invention may contain other ingredients such as stabilizing additives, colorants, color change additives, additional polymeric binders etc. as are present in many lithographic plate compositions.

The following Examples more particularly serve to illustrate various embodiments of the present invention described hereinabove.

EXAMPLES

Materials

The following products are referred to hereinafter:

Resin A: Rutaphen LB6564 —a phenol/cresol novolak resin marketed by Bakelite, U.K.

Resin B: Rutaphen LB744 —a cresol novolak resin marketed by Bakelite, UK.

Dye A: Ethyl Violet (basic violet 4, C.I. 42600) as supplied by Aldrich Chemical Company of Gillingham, England.

Dye B: Victoria Blue BO (basic blue 7, C.I. 42595) as supplied by Aldrich Chemical Company of Gillingham, England.

Siloxane A: Silikophen P50X, a solution of a phenyl methyl siloxane as supplied by Tego Chemie Service GmbH of Essen, Germany.

Siloxane B: Silikophen P70 MPA, a solution of a phenyl methyl siloxane as supplied by Tego Chemie Service GmbH of Essen, Germany.

NQD A: Dihydroxybenzophenone bis 2,1,5 naphthoquinonediazide ester as supplied by A.H.Marks Ltd., of Bradford, England NQD B: Diazo RO825. a naphthoquinonediazide—resin ester as supplied by Rohner AG of Pratteln, Switzerland.

Developer A: Ozasol EP 260 Developer as supplied by Agfa—Gevaert, Wiesbaden, Germany Developer B: An aqueous developing solution Goldstar, as supplied by Horsell Graphic Industries Ltd, Leeds, UK.

Developer C: An aqueous developing solution Greenstar, as supplied by Horsell Graphic Industries Ltd, Leeds, UK.

Developer D: An aqueous developing solution containing sodium metasilicate pentahydrate at a concentration of 10% w/w.

Developer E: An aqueous developing solution of 2.5% w/w potassium hydroxide.

Solvent A: 2-ethoxyethanol

Solvent B: 1-methoxypropan-2-ol

Assessment of Plates

Assessment 1: Coating Weight Loss in Developer A

A plate was cut into a disc with an area of 100 $cm^2$. The sample was immersed in developer at a 20° C. for 120 seconds, removed, placed in a beaker of water, then the plate surface wiped with a damp piece of cotton wool to remove any loose coating. The disc was rinsed with water and dried. The sample was weighed then the remaining, coating was removed by immersion in acetone. The plate was dried once again and re-weighed. The amount of coating lost in the developer, as a percentage of the original film weight was calculated using a reference film weight from a disc taken adjacently from the sample. The figures quoted are the percentage of coating film weight removed by the developer. Higher values indicate the more attack suffered by the coating.

Assessment 2: Coating Weight Loss in Developer B

This was as assessment 1 but developer B was used instead of developer A, the dwell time was 60 seconds and the temperature of the developer was 25° C.

Assessment 3: Coating Weight Loss in Developer B

This was as assessment 2 but the dwell time was increased to 120 seconds.

Assessment 4: Coating Colour Difference in Developer A

The color of a plate was measured using a Minolta CR-331 Chromameter as supplied by Minolta Camera Co. Ltd. of Osaka, Japan. The plate was then placed in a tray and developer A at 20° C. poured over the plate. The developer was gently agitated by moving the tray for 60 seconds. The plate was removed from the tray, rinsed with water and dried. The color of the plate was then re-measured using the Chromameter. The change in L value was calculated. The greater the change in L value, the more coating that was lost during the development process.

Assessment 5: Coating Colour Difference in Developer A

This was as assessment 4 but the dwell time in developer was 120 seconds.

Assessment 6: Coating Colour Difference in Developer D

A plate was partly immersed in a beaker of developer D at 20° C. for 1 minute, removed, rinsed and dried. The color of the plate both where developer had met the plate and where no developer had met the plate was measured using a Chromameter. The difference in L value was calculated. The greater the change in L value, the more coating that was lost during the immersion in developer.

Assessment 7: Coating Colour Difference in Developer E

This was as assessment 6 but using developer E.

Assessment 8: Coating Colour Difference in Developer D

This was as assessment 6 but the immersion in developer D was for 2 minutes.

Assessment 9: Coating Colour Difference in Developer E

This was as assessment 8 but using developer E.

Assessment 10: Plate Speed

A plate was image-wise exposed using a Montakop light-frame as supplied by Siegfried Theimer GmbH, Bad Homburg, Germany, using a Stouffer control strip. The plate was then developed by pouring developer C at 20° C. over the plate and wiping with cotton wool for 1 minute. The plate was then rinsed with water and dried. The readings on the control strip were recorded to determine the amount of exposure required to give a clear 3 reading on the Stouffer control strip. The results were recorded as the number of light units. Results differing less than 15% would be considered to be within experimental error.

Comparative Example C1 and Example 1

Step 1—Preparation of Formulation

The formulations were prepared using the components described in the table below as follows: Dye A, Resin A & Resin B were each dissolved in solvent A. The appropriate amounts of each solution were combined with the other materials and the mixture stirred for 4 hours.

|  | % composition of the dry film | |
| --- | --- | --- |
| Component | Comparative example C1 | Example 1 |
| Dye A | 1.7 | 1.7 |
| Resin A | 62.9 | 61 |
| Resin B | 15.7 | 15.2 |
| NQD A | 19.7 | 19.1 |
| Siloxane A | — | 3 |

Step 2—Preparation of Printing Plates

The formulations prepared in step 1 were each applied to a substrate of 0.3 mm sheet of aluminum that had been electrograined and anodised and post-anodically treated with an aqueous solution of an inorganic phosphate. The coating solutions were coated onto the substrate by means of a wire wound bar using a K303 coater as supplied by R. K. Print Coat Instruments Ltd. of Royston, England. The solution concentration was selected to provide the specified dry film compositions with a coating weight of approximately 2.0 $gm^{-2}$ after drying at 130° C. for 80 seconds in a Mathis Labdryer LTE oven (as supplied by Werner Mathis AG, Zurich, Switzerland).

Results:

| Plate Assessment | C1 | Example 1 |
| --- | --- | --- |
| 2 | 44 | 29 |
| 3 | 100 | 70 |
| 10 | 40 | 40 |

Comparative Example C2 and Examples 2 & 3

Step 1—Preparation of Coating Solution

The formulations were prepared using the components described in the table below as follows: Resin A, Dye B and NQD B were each dissolved in solvent A. The appropriate amounts of each solution were combined and the mixture stirred for 4 hours.

|  | % composition of the dry film | | |
| --- | --- | --- | --- |
| Component | Comparative example C2 | Example 2 | Example 3 |
| NQD B | 90 | 87.38 | 84.91 |
| Resin A | 8.5 | 8.25 | 8.02 |
| Dye B | 1 | 1.46 | 1.41 |
| Siloxane A | — | 2.91 | 5.66 |

Step 2—Preparation of Printing Plates

The preparation of printings plates was as described in example 1.

Results:

| Plate Assessment | C2 | Example 2 | Example 3 |
| --- | --- | --- | --- |
| 1 | 47 | 2 | 0 |
| 3 | 45 | 30 | 30 |
| 4 | 6.51 | 0.65 | 0.14 |
| 5 | 9.83 | 1.75 | 0.1 |
| 6 | 9.17 | 2.11 | 0.9 |
| 7 | 5.46 | 1.02 | 0.27 |
| 8 | 27.14 | 8.7 | 5.94 |
| 9 | 15.65 | 3.54 | 2.83 |
| 10 | 80 | 91 | 91 |

Comparative C4 and Example 4

The procedure described above was followed but solvent A was replaced by solvent B and Siloxane A was replaced by Siloxane B.

|  | % composition of the dry film | |
|---|---|---|
| Component | Comparative example C4 | Example 4 |
| NQD B | 90 | 87.38 |
| Resin A | 8.5 | 8.25 |
| Dye B | 1 | 1.46 |
| Siloxane B | — | 2.91 |

Results:

| Plate Assessment | C4 | Example 4 |
|---|---|---|
| 1 | 43 | 3 |
| 3 | 47 | 39 |
| 4 | 4.18 | 0.62 |
| 5 | 7.68 | 2.01 |
| 6 | 11 | 5.97 |
| 7 | 5.62 | 2.18 |
| 8 | 28.11 | 16.2 |
| 9 | 15.32 | 6.87 |
| 10 | 80 | 91 |

Comparative Example C5 and Example 5 a solution of Siloxane A was prepared at 3% w/w by adding Siloxane A to xylene and stirring. This solution was applied to an Alphapos III positive working printing plate as supplied by Horsell Graphic Industries Ltd. by means of the coating method of example 1 to provided a dry film weight of 35 gm$^{-2}$. An Alphapos III plate without the Siloxane coating was used as comparative example C5.

Results:

| Plate Assessment | C5 | Example 5 |
|---|---|---|
| 5 | 22.71 | 1.24 |
| 10 | 100 | 88 |

What is claimed is:

1. A positive working lithographic plate precursor comprising:
   a support having a hydrophilic surface; and
   a coating thereon;
   in which:
   the coating comprises a positive working, photosensitive composition and an aryl alkyl polysiloxane; and
   the aryl alkyl polysiloxane comprises up to 10% of the total dry coating weight of the coating, wherein at least part of said aryl alkyl polysiloxane is present as a thin layer at an uppermost surface of said plate precursor.

2. The positive working lithographic plate precursor of claim 1 wherein the aryl alkyl polysiloxane is a phenyl methyl polysiloxane.

3. The positive working lithographic plate precursor of claim 1 wherein the positive working photosensitive composition comprises an o-napthoquinonediazide component.

4. The positive working lithographic plate precursor of claim 1 wherein the support having a hydrophilic surface comprises a treated aluminum plate.

5. The positive working lithographic printing plate precursor of claim 1 in which the positive working photosensitive composition comprises an o-napthoquinonediazide component and a phenolic resin.

6. The positive working lithographic printing plate precursor of claim 5 in which the aryl alkyl polysiloxane is phenyl methyl polysiloxane.

7. The positive working lithographic printing plate precursor of claim 6 in which the aryl alkyl polysiloxane comprises 0.3% to 10% by weight of the dry coating weight of the coating.

8. The positive working lithographic printing plate precursor of claim 7 in which the aryl alkyl polysiloxane is a phenyl methyl polysiloxane.

9. The positive working lithographic printing plate precursor of claim 1 in which the aryl alkyl polysiloxane comprises 0.3% to 10% by weight of the dry coating weight of the coating.

10. The positive working lithographic printing plate precursor of claim 9 in which the aryl alkyl polysiloxane is a phenyl methyl polysiloxane.

11. The positive working lithographic printing plate precursor of claim 9 in which the aryl alkyl polysiloxane has a dry coating weight of 0.02 to 0.6 g/m$^2$.

12. The positive working lithographic printing plate precursor of claim 1 in which the aryl alkyl polysiloxane comprises 1 to 10% by weight of the dry coating weight of the coating.

13. The positive working lithographic printing plate precursor of claim 1 in which the photosensitive composition comprises 90 to 99% of the dry coating weight of the coating.

14. A positive working lithographic plate precursor comprising:
    a support having a hydrophilic surface; and
    a coating thereon;
    in which:
    the coating comprises an ink receptive positive working, photosensitive composition and an aryl alkyl polysiloxane, the aryl alkyl polysiloxane comprising up to 10% of the total dry coating weight of the coating, and wherein said coating has a surface exhibiting receding contact angle in water greater than 48°.

15. The positive working lithographic printing plate precursor of claim 14 wherein the aryl alkyl polysiloxane has a dry film weight of 0.02 to 0.6 g/m$^2$.

16. The positive working lithographic printing plate precursor of claim 14 wherein the support having a hydrophilic surface comprises a treated aluminum plate.

17. The positive working lithographic printing plate precursor of claim 14 in which the aryl alkyl polysiloxane comprises 0.3% to 10% by weight of the dry coating weight of the coating.

18. The positive working lithographic printing plate precursor of claim 17 in which the aryl alkyl polysiloxane is a phenyl methyl polysiloxane.

19. The positive working lithographic printing plate precursor of claim 14 in which the aryl alkyl polysiloxane comprises 1 to 10% by weight of the dry coating weight of the coating.

20. The lithographic printing plate precursor according to claim 14 wherein said receding contact angle is approximately about 67°.

21. The positive working lithographic printing plate precursor of claim 20 wherein the layer comprising the aryl alkyl polysiloxane has a dry film weight of 0.02 to 0.6 g/m$^2$.

22. The positive working lithographic printing plate precursor of claim 20 wherein the support having a hydrophilic surface comprises a treated aluminum plate.

23. The positive working lithographic printing plate precursor of claim 20 wherein the positives working photosensitive composition comprises a phenolic resin.

24. The positive working lithographic printing plate precursor of claim 20 in which the aryl alkyl polysiloxane comprises 1 to 10% by weight of the dry coating weight of the coating.

25. The positive working lithographic printing plate precursor of claim 20 begin which the aryl alkyl polysiloxane comprises 0.3% to 10% by weight of the dry coating weight of the coating.

26. The positive working lithographic printing plate precursor of claim 25 in which the aryl alkyl polysiloxane is a phenyl methyl polysiloxane.

27. A method of preparing a positive working lithographic plate precursor comprising:

coating on a support having a hydrophilic surface, an ink receptive coating comprising, in admixture, a positive working photosensitive composition and an aryl alkyl polysiloxane;

in which:

the aryl alkyl polysiloxane comprises up to 10% of the total dry coating weight of the coating thereby to form said positive working lithographic plate precursor; and at least part of said aryl alkyl polysiloxane forms a thin layer at an uppermost surface of plate precursor.

28. The method of claim 27 wherein the aryl alkyl polysiloxane comprises at least 0.3% to up to 10% by weight of the dry coating weight.

29. The method of claim 27 wherein the aryl alkyl polysiloxane comprises 1% to up to 10% by weight of the dry coating weight.

30. The method of claim 27 wherein the photosensitive composition comprises 90 to 99% of the dry coating weight.

31. The method of claim 27 wherein the positive working photosensitive composition comprises an o-napthoquinonediazide component.

32. The method of claim 31 wherein the o-napthoquinonediazide component comprises a sulphonyl ester or a carboxylic acid ester.

33. The method of claim 31 wherein the o-napthoquinonediazide component comprises a sulphonyl ester of a phenolic resin.

34. The method of claim 27 wherein the support comprises a treated aluminum plate.

35. The method of claim 27 in which the positive working photosensitive composition comprises an o-napthoquinonediazide component and a phenolic resin.

36. The method of claim 35 in which the aryl alkyl polysiloxane is phenyl methyl polysiloxane.

37. The method of claim 36 wherein the aryl alkyl polysiloxane comprises at least 0.30to up to 10 by weight of the dry coating weight.

* * * * *

UNITED STATES PATENT AND TRADEMARK OFFICE
CERTIFICATE OF CORRECTION

PATENT NO.    : 6,420,087 B1
DATED         : July 16, 2002
INVENTOR(S)   : Bennett et al.

It is certified that error appears in the above-identified patent and that said Letters Patent is hereby corrected as shown below:

Column 3,
Line 52, delete "aluminium" and insert therefore -- aluminum --;

Column 6,
Line 62, after the word "Comparative" and before "C4", insert therefore the word -- Example --;

Column 7,
Line 28, delete "a" and insert therefore -- A --;
Line 34, delete "35" and insert therefore -- .35 --;

Column 9,
Line 2, delete "positives" and insert therefore -- positive --;
Line 9, delete "begin" and insert therefore -- in --;

Column 10,
Line 24, delete "0.30to up to 10" and insert therefore -- .3% to up to 10% --.

Signed and Sealed this

Fourth Day of February, 2003

JAMES E. ROGAN
*Director of the United States Patent and Trademark Office*